(12) United States Patent
Ali et al.

(10) Patent No.: US 8,446,303 B2
(45) Date of Patent: May 21, 2013

(54) SYSTEM AND METHOD OF ANALOG-TO-DIGITAL CONVERTERS

(75) Inventors: Ahmed Mohamed Abdelatty Ali, Oak Ridge, NC (US); Bryan Scott Puckett, Stokesdale, NC (US); Joseph Michael Hensley, Lexington, NC (US)

(73) Assignee: Analog Devices, Inc., Norwood, MA (US)

( * ) Notice: Subject to any disclaimer, the term of this patent is extended or adjusted under 35 U.S.C. 154(b) by 363 days.

(21) Appl. No.: 12/903,692

(22) Filed: Oct. 13, 2010

(65) Prior Publication Data
US 2012/0092198 A1    Apr. 19, 2012

(51) Int. Cl.
*H03M 1/06* (2006.01)

(52) U.S. Cl.
USPC ........... 341/118; 341/117; 341/119; 341/120; 341/155; 341/161

(58) Field of Classification Search
USPC .................................. 341/117–120, 155, 161
See application file for complete search history.

(56) References Cited

U.S. PATENT DOCUMENTS

| | | | |
|---|---|---|---|
| 6,700,524 B2* | 3/2004 | Naka et al. ................ | 341/161 |
| 6,839,009 B1* | 1/2005 | Ali ........................... | 341/118 |
| 6,900,749 B2* | 5/2005 | Tani et al. ................. | 341/118 |
| 7,042,373 B2* | 5/2006 | Tsai et al. .................. | 341/120 |
| 7,271,750 B1 | 9/2007 | Ali | |

OTHER PUBLICATIONS

Ali et al., "A 14-bit 125 MS/s IF/RF Sampling Pipelined ADC With 100 dB SFDR and 50 fs Jitter", J. Solid-State Circuits, vol. 41. No. 8, pp. 1846-1855, Aug. 2006.
Devarajan et al., "A 16b 125 MS/s 385mW 78.7dB SNR CMOS pipeline ADC", ISSCC Dig. Tech. Papers, pp. 86-87, Feb. 2009.
Siragusa and Galton, "A Digitally Enhanced 1.8-V 15 bit 40-MSample/s CMOS Pipelined ADC", IEEE J. Solid State Circuits, vol. 39, pp. 2126-2138, Dec. 2004.
Panigada and Galton, "A 130mW 100MS/s pipelined ADC with 69dB SNDR enabled by digital harmonic distortion correction", ISSCC Dig. Tech. Papers, pp. 162-163, Feb. 2009.
Iroaga and Murmann, "A 12-Bit 75-MS/s Pipelined ADC Using Incomplete Settling", J. Solid-State Circuits, vol. 42, No. 4, pp. 748-756, Apr. 2007.
Murmann and Boser, "A 12 b 75 MS/s Pipelined ADC using open-loop residue amplification" ISSCC Dig. TEch. Papers, pp. 328-497, vol. 1, Feb. 2003.

\* cited by examiner

*Primary Examiner* — Jean B Jeanglaude
(74) *Attorney, Agent, or Firm* — Kenyon & Kenyon LLP

(57) ABSTRACT

An analog-to-digital converter system that includes a pipeline including N successively-cascaded signal converters, each converting, according to a first clock signal, a respective portion of an input signal of the pipeline into digital codes, a code aligner for receiving and aligning the digital codes from the signal converters in the pipeline into a digital output of the system, an error extractor coupled to an amplifier input node of a selected one signal converter via a first switch for extracting an error signal, and a load system coupled to the amplifier input node of the selected one signal converter via a second switch.

18 Claims, 7 Drawing Sheets

SYSTEM AND METHOD OF ANALOG-TO-DIGITAL CONVERTERS

FIELD OF THE INVENTION

The present invention is generally directed to analog-to-digital converters (ADCs). In particular, the present invention is directed to a system and method that may reduce errors caused by clock spurs in pipelined ADCs.

BACKGROUND INFORMATION

Pipelined analog-to-digital converters (ADCs) may include a series of cascaded ADC stages each of which is responsible for converting a portion of an analog signal into digital codes. The digital codes of all portions of the analog signal may be eventually aligned to form a digital output representing the analog signal. Pipelined ADCs may be used in high-speed and high-resolution analog-to-digital conversion applications because the pipeline may break down the task of analog-to-digital conversion into a series of subtasks that may be performed at high sampling rates. One limitation of pipelined ADCs is that errors at earlier stages that commonly correspond to more significant bits may propagate downstream to subsequent stages. For example, U.S. Pat. No. 7,271,750 (the '750 patent, the content of which is incorporated by reference in its entirety) discusses errors caused by a finite amplifier gain. To correct these errors, the '750 patent introduces error extraction circuits to estimate the finite gain of the amplifier. In practice, the error extraction circuit may run at a slower clock than the high speed clock of the main pipeline. For example, the error extraction circuit may extract errors one out of every M (>=1) clock cycles for the gain estimation. The estimated gain may be used to calibrate the eventual digital output.

One limitation with the system as described in the '750 patent is that the slow clock for error extraction and correction may exert spurious loads on the pipeline, thereby causing spur noise in the digital outputs when the slow clock does occur. The spur noise may constitute an additional source of errors that have not been addressed by the current art. Therefore, there is a need for systems and methods that mitigate the spur noise due to mixed clock speeds in pipelined ADCs.

DETAILED DESCRIPTION OF EXAMPLE EMBODIMENTS

Embodiments of the present invention may provide an analog-to-digital converter system that includes a pipeline including N successively-cascaded signal converters, each converting, according to a first clock signal, a respective portion of an input signal of the pipeline into digital codes, a code aligner for receiving and aligning the digital codes from the signal converters in the pipeline into a digital output of the system, an error extractor coupled to an amplifier input node of a selected one signal converter via a first switch to extract an error signal, and a load system coupled to the amplifier input node of the selected one signal converter via a second switch. Embodiments of the present invention also may provide that all but a last one of the signal converters include an amplifier for amplifying a signal at an amplifier input node with a gain to an output signal, and the digital codes generated by a signal converter correspond to the output signal of a preceding signal converter in the pipeline. Further, the embodiments may provide that the first switch is engaged according to a second clock signal; when the first switch is engaged, the error extractor exerts a load to the pipeline; the second switch is engaged according to a third clock signal; and when the second switch is engaged, the load system provides a load substantially the same as the load of the error extractor to the pipeline.

Figure 1:
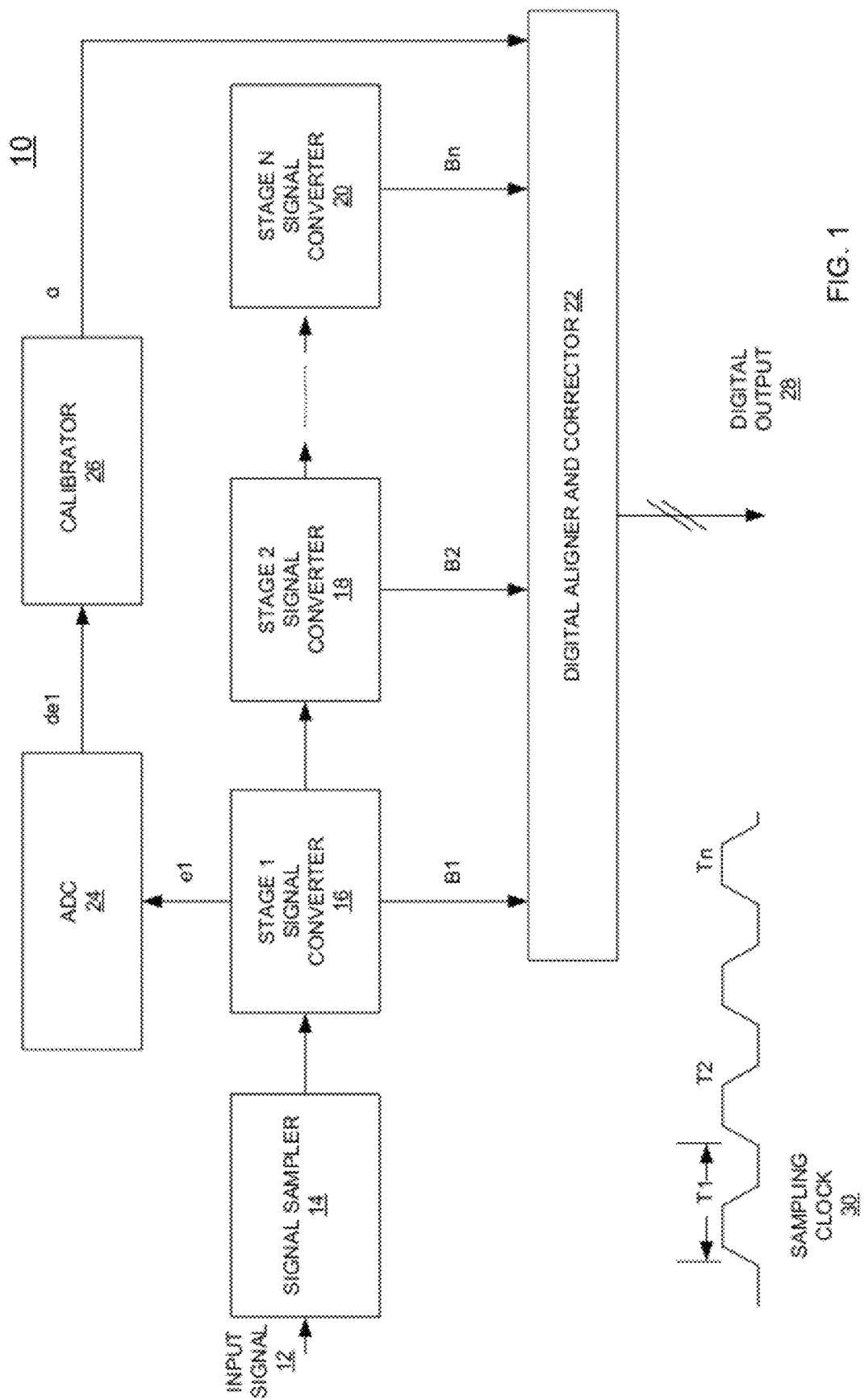
FIG. 1 illustrates a pipelined ADC according to an exemplary embodiment of the present invention.

FIG. 1 illustrates a pipelined ADC according to an exemplary embodiment of the present invention. The pipelined ADC 10 may have a main pipeline that may include a signal sampler 14 for sampling an input signal 12 and stages of cascaded signal converters 16, 18, . . . , 20 for converting respective portions of the input signal 12 into digital codes B1, B2, . . . , Bn. Additionally, the pipelined ADC 10 may include an associated error processing pipeline that may include a digital aligner and corrector 22 for aligning and assembling digital codes B1, B2, . . . , into a digital output 28, an ADC 24 for converting errors extracted from a selected signal converter stage (e.g., stage 1 as shown in FIG. 1), and a calibrator 26 for computing an adjustment that may be used to adjust the eventual digital output 28. The associated error processing pipeline may be coupled to the main pipeline one out of M (greater than or equal to 1) clock cycles.

In the main pipeline, the signal sampler 14 may receive an analog input signal 12 and provide at its output a sample of the input signal 12 to the cascaded signal converters 16, 18, . . . , 20. The sample may be in the form of a voltage signal. Each of the signal converters may be responsible for converting a certain portion of the sample of the input signal 12. These portions of the sample of the input signal 12 may be respectively converted into digital codes B1, B2, . . . , Bn that may have different levels of significance. Each of the B1, B2, . . . , Bn may have one or more bits. In one example embodiment, the output B1 of the signal converter 16 (at stage 1 that is directly coupled to the signal sampler 14) may correspond to the most significant bits, and the output of each subsequent stage may have progressively less significance until Bn of the signal converter 20 at stage N. The digital codes B1, B2, . . . , Bn from signal converters 16, 18, . . . , 20 may be supplied to the digital aligner and corrector 22 in which B1, B2, . . . , Bn may be aligned to form the digital output 28. As discussed in the '075 patent and in the following, due to finite gain of differential amplifiers in the signal converters, the digital codes B1, B2, . . . , Bn may contain errors. Errors at stages of more significant bits may be particularly troublesome because they may be propagated downstream to other stages. Thus in the example embodiment as illustrated in FIG. 1, an error $e_1$ may be estimated from the signal converter 16 at stage 1 and be provided to an ADC 24 to be converted into a digital form $de_1$ representing the error $e_1$. The digital $de_1$ may be provided to the calibrator 26 for computing a calibration factor α which may be further provided to the digital aligner and corrector 22 for adjusting the digital output 28.

In operation, the main pipeline of cascaded signal converters may run according to the high speed sampling clock. Thus, at a first half of clock cycle T1 of the sampling clock 30, the signal converter 16 at stage 1 may receive a sample S1 from the signal sampler 14 and convert a portion of S1 into a digital code B1. At a second half of clock cycle T1, signal converter 16 may output the digital code B1 to the digital aligner and corrector 22 and output residual portions of S1 to signal convert 18 at stage 2. During a subsequent clock cycle T2, the signal converter 18 at stage 2 may similarly process the residual portions of sample S1. At a first half of clock cycle T2, signal converter 18 may receive the residual portions of S1 and convert a portion of the residual portions into digital code B2. At a second half of clock cycle T2, signal converter 18 may output digital code B2 to the digital aligner and corrector 22 and output remaining residual portions of S1 to a next signal converter stage. Thus, each signal converter in the pipeline may be responsible for processing a portion of S1 at a clock cycle until the signal converter stage N processes the last portion of S1 at clock cycle Tn.

During clock cycle T2, the signal converter 16 at stage 1 may proceed to process next sample of the analog signal 12 and so on. In this way, the main pipeline may operate at full sampling speed. The digital aligner and corrector 22 may, over n clock cycles, receive B1, B2, . . . , Bn for a sample of the analog signal. The digital aligner and corrector 22 may provide appropriate delays to B1, B2, . . . , Bn so that they may be properly aligned for an eventual digital output 28. Since the main pipeline runs at the high sampling rate, the digital aligner and corrector 22 may output the digital output 28 at the same sampling rate with a delay of n clock cycles.

As discussed in the '075 patent, the digital codes B1, B2, . . . , Bn from signal converters in the main pipeline may contain errors due to finite gains of differential amplifiers. The errors at earlier stages such as stage 1 may be particularly undesirable because they correspond to more significant bits and propagate along the main pipeline. Thus, these earlier stages of signal converters may need calibration to mitigate these errors. FIG. 1 illustrates calibration for signal converter 16 at stage 1 according to an example embodiment. Signal converter 16 may include circuits that extract an error e1 caused by finite gain of a differential amplifier. ADC 24 may, during clock cycle T1, convert e1 into digital form de1 from which calibrator 26 may compute an adjustment factor α for an eventual adjustment of the digital output 28 at the digital aligner and corrector 22. The '075 patent provided an example implementation of the calibrator 26 using a least mean square (LMS) method. The calibration as shown in FIG. 1 may operate at a slower clock than the main pipeline. For example, the error extraction may occur one of out M digital outputs, where M is an integer larger than one. Thus, the associated error processing pipeline of ADC 24 and calibrator 26 may run at a different and slower clock than the main pipeline. Since the pipelined ADC 10 may include both fast and slow clocks, the slow clock may cause spur noise.

Figure 2:
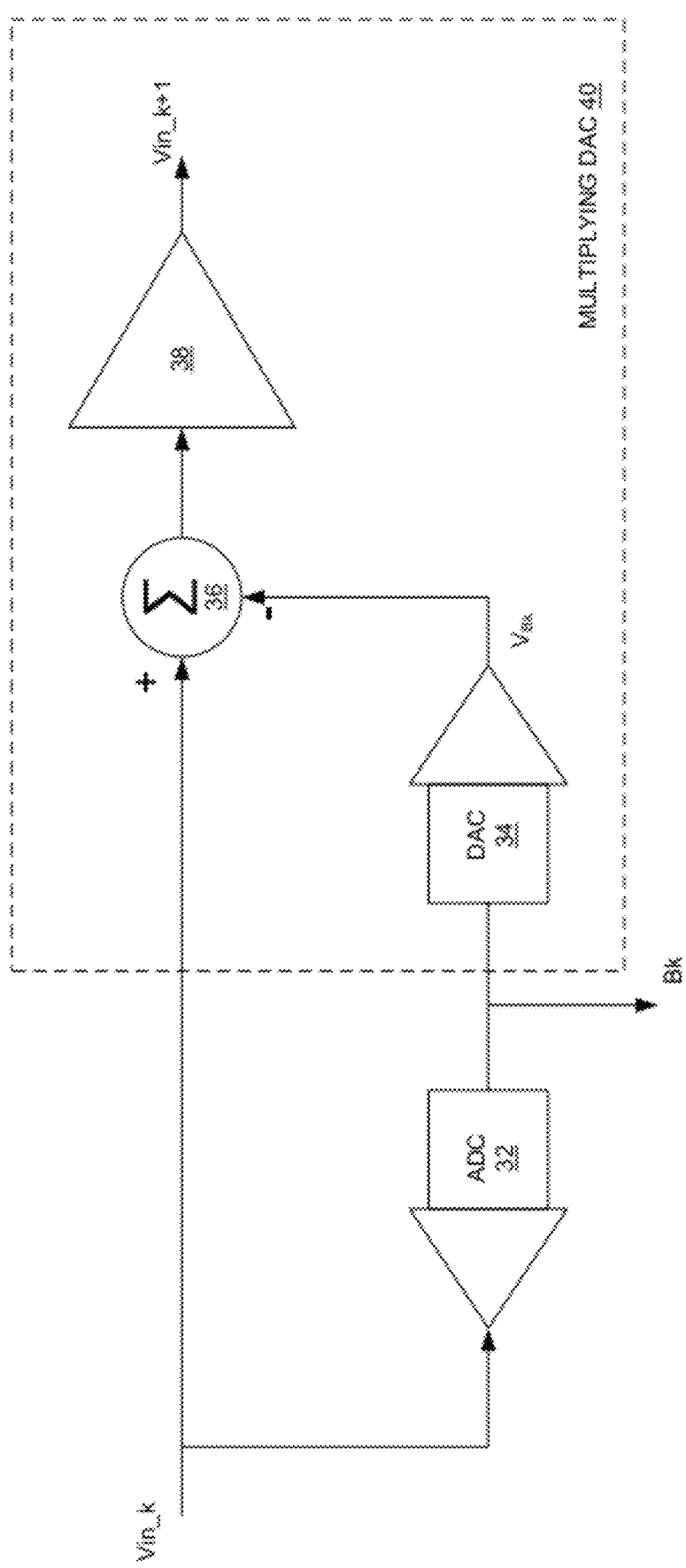
FIG. 2 illustrates a signal converter stage according to an exemplary embodiment of the present invention.

FIG. 2 illustrates a signal converter stage according to an exemplary embodiment of the present invention. The signal converter stage may be one of the signal converters of the main pipeline and is referred to as stage k for convenience.

The signal converter k may include an ADC 32, a digital-to-analog converter (DAC) 34, an summer 36, and an amplifier 38.

The signal converter k may receive an input signal Vin_k from a previous stage. ADC 32 may convert Vin_k into a digital code Bk as an output from this stage. The digital code Bk may correspondingly approximate the input voltage Vin_k (or the voltage output from preceding stage). DAC 34 may be coupled to the ADC 32 to convert the digital codes Bk back into an analog voltage $V_{Bk}$ whose amplitude corresponds to the digital codes Bk. The summer 36 may receive at its inputs Vin_k and $V_{Bk}$, and generate a residual signal Vin_k–$V_{Bk}$. The amplifier 38 may "gain" up the residual signal to generate an input Vin_k+1 for next stage k+1.

Figure 3:
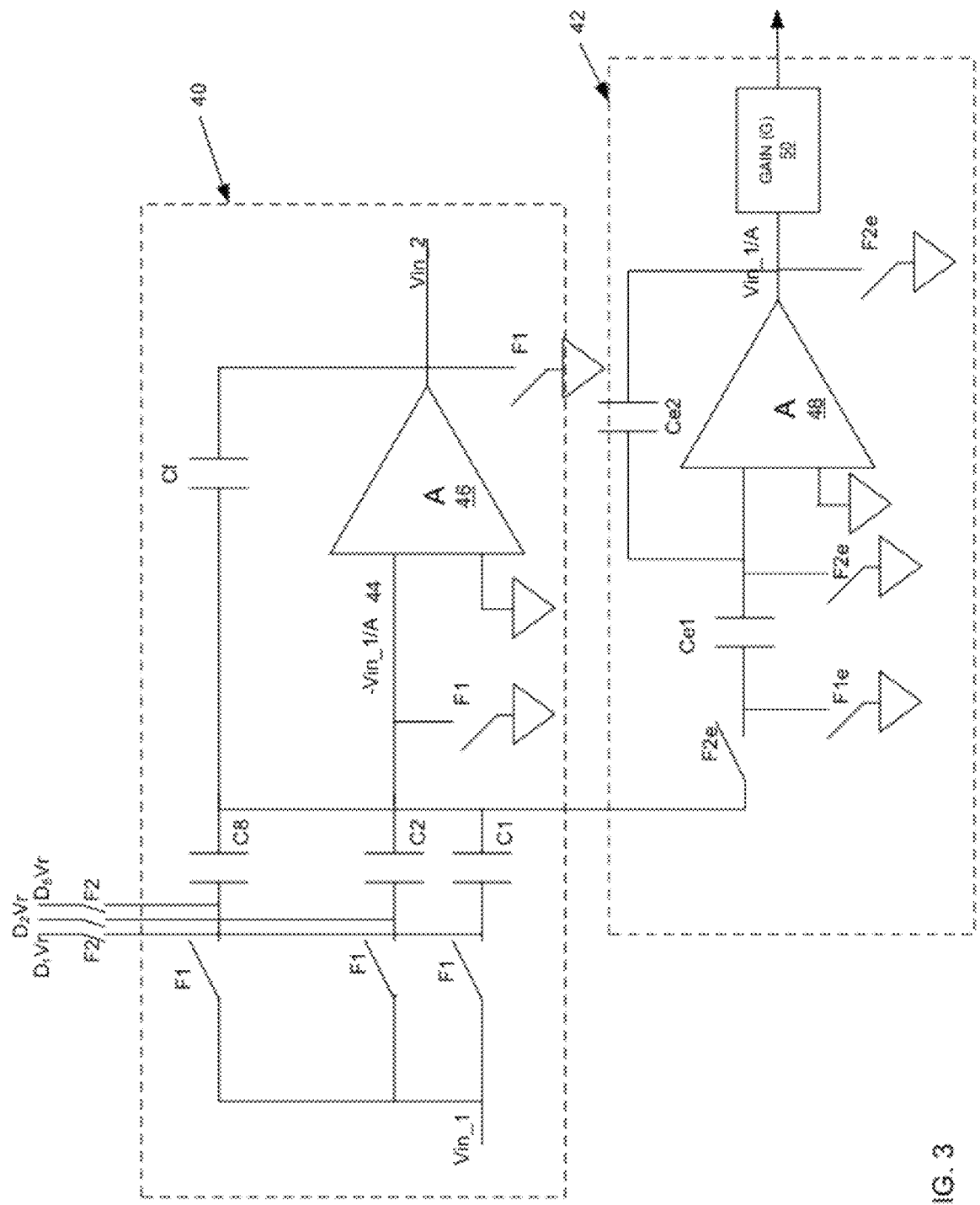
FIG. 3 illustrates a multiplying ADC and an error extraction circuit according to an exemplary embodiment of the present invention.

DAC 34, summer 36, and amplifier 38 may be collectively referred to as a multiplying DAC 40. FIG. 3 illustrates an implementation of the multiplying DAC (MDAC) 40 and an associated error extraction circuit 42. The implementation is similar to FIG. 4 of the '075 patent. In this implementation, the MDAC 40 shows a 3-bit converter for illustration purpose. Other types of converter (such as 1.5-bit) may also be implemented similarly. The MDAC 40 as shown in FIG. 3 may include eight input capacitors C1, C2, . . . , C8, a feedback capacitor Cf, and an amplifier 46. The MDAC 40 may also include a number of switches that include a first group of switches engaging and disengaging according clock cycle F1 and a second group of switches engaging and disengaging according to clock cycle F2. The clock cycles F1 and F2 as shown in FIG. 5 may have opposite phases. Thus, when the first group of switches are engaged during a first half cycle of F1, the second group of switches may be disengaged so that the input capacitors C1, C2, . . . , C8 may be charged with the input voltage Vin_1 (assuming that the MDAC 40 is part of the signal converter at stage 1) and the feedback capacitor Cf may be discharged. Alternatively, when the second group of switches are engaged during a second half cycle of F2, the first group of switches are disengaged. The input capacitors C1, C2, . . . , C8 may be supplied with voltages D1Vr, D2Vr, . . . , D8Vr, each respectively corresponding to digital output B1, B2, . . . , B8 of this stage. The input capacitors C1, C2, . . . , C8, the feedback capacitor Cf, and the amplifier 46 may form circuit that provides a voltage signal V2_in for next stage of signal converter.

As discussed in the '075 patent, when the amplifier 46 is ideal—i.e., when its gain is infinite, the output voltage V2_in is the difference (V1_in–DVr) multiplied by a gain G, where DVr represents the combination of D1Vr, D2Vr, . . . , D8Vr, and the gain G is determined by a ratio between Cf and a combination of the input capacitors C1, C2, . . . , C8. However, in practice, the amplifier 46 may have a finite gain A rather than an infinite gain. The finite gain A may introduce an additional error term of G*V1_in/A to the input V2_in for subsequent stages. Previously, the '075 patent noted that V1_in/A may be extracted from the summing node 44 of the amplifier 46.

FIG. 3 illustrates a capacitor-amplifier error extraction circuit 42. The circuit 42 may include capacitors Ce1, Ce2, an amplifier 48, and a gain circuit 50. The circuit 42 also may include a third group of switches engaging and disengaging according to a clock cycle F1e and a forth group of switches engaging and disengaging according to a clock cycle F2e. The clock cycles F1e and F2e may have opposite phases. Thus, when a clock cycle F2e occurs (e.g., when F2e is at high), switches that run according to F2e may be engaged (and the switch runs according to F1e may be disengaged) so that the error extraction circuit 42 may be coupled to the MDAC 40, Ce1 may be charged with V1_in/A, and capacitor Ce2 may be discharged. When clock cycle F1e occurs, the switch that runs according to F1e may be engaged so that the error extraction circuit 42 may be decoupled from the MDAC 40, and the charge Vin_1/A on capacitor Ce1 may be transferred to Ce2. When the capacitance of capacitor Ce1 equals that of capacitor Ce2, and the gain of amplifier 48 is substantially high enough, the output at the error extraction circuit 42 may be the same or substantially the same as Vin_1/A. A further gain circuit 50 may boost the final output to G*Vin_1/A—which may be provided to the digital aligner and corrector 22 for adjusting the digital output 28.

As shown in FIG. 5, the clocks F1e and F2e of the error extraction circuit may run at a slower speed than the clocks F1 and F2 of the main pipeline. For the example as shown in FIG. 5, F2e may occur one out of every three cycles of F1 or F2. Other ratios also may be used so long the ratio is no less than one. Thus, the F2e clock may occur in faster or slower paces, but always slower than the sampling rate of the main pipeline. When F2e occurs, the error extraction circuit is coupled to the MDAC 40 and may exert an load on to the MDAC 40 in the main pipeline. In this example embodiment, the load may be Ce1. Alternatively, when F2e does not occur, the error extraction circuit is decoupled from the MDAC 40 and may not exert any load on the MDAC 40. This sporadic appearances of loads to the main pipeline may cause spur noise in the outputs and degrade the system performance.

Figure 4:
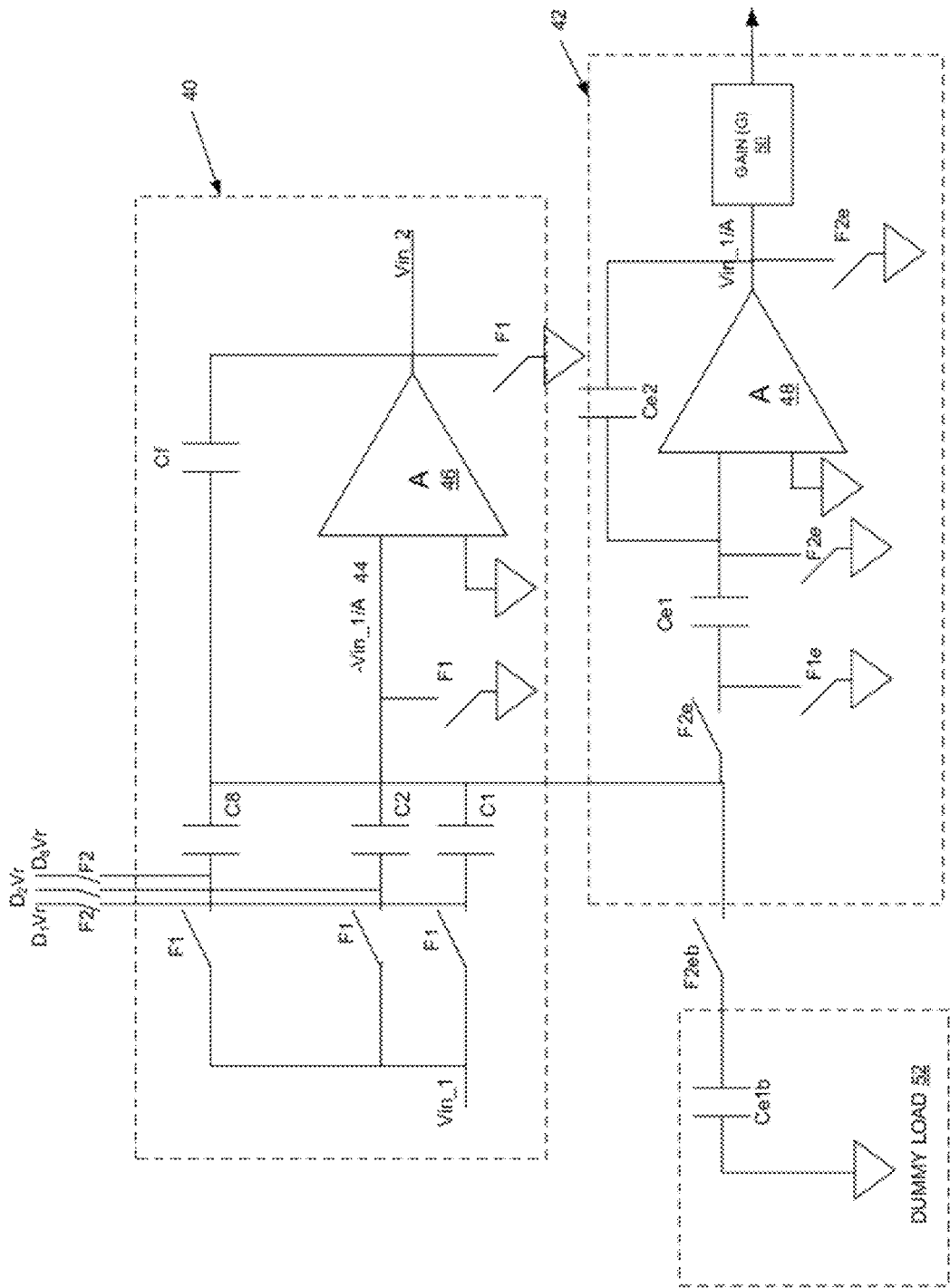
FIG. 4 illustrates a multiplying ADC with a load balance system according to an exemplary embodiment of the present invention.
Figure 5:
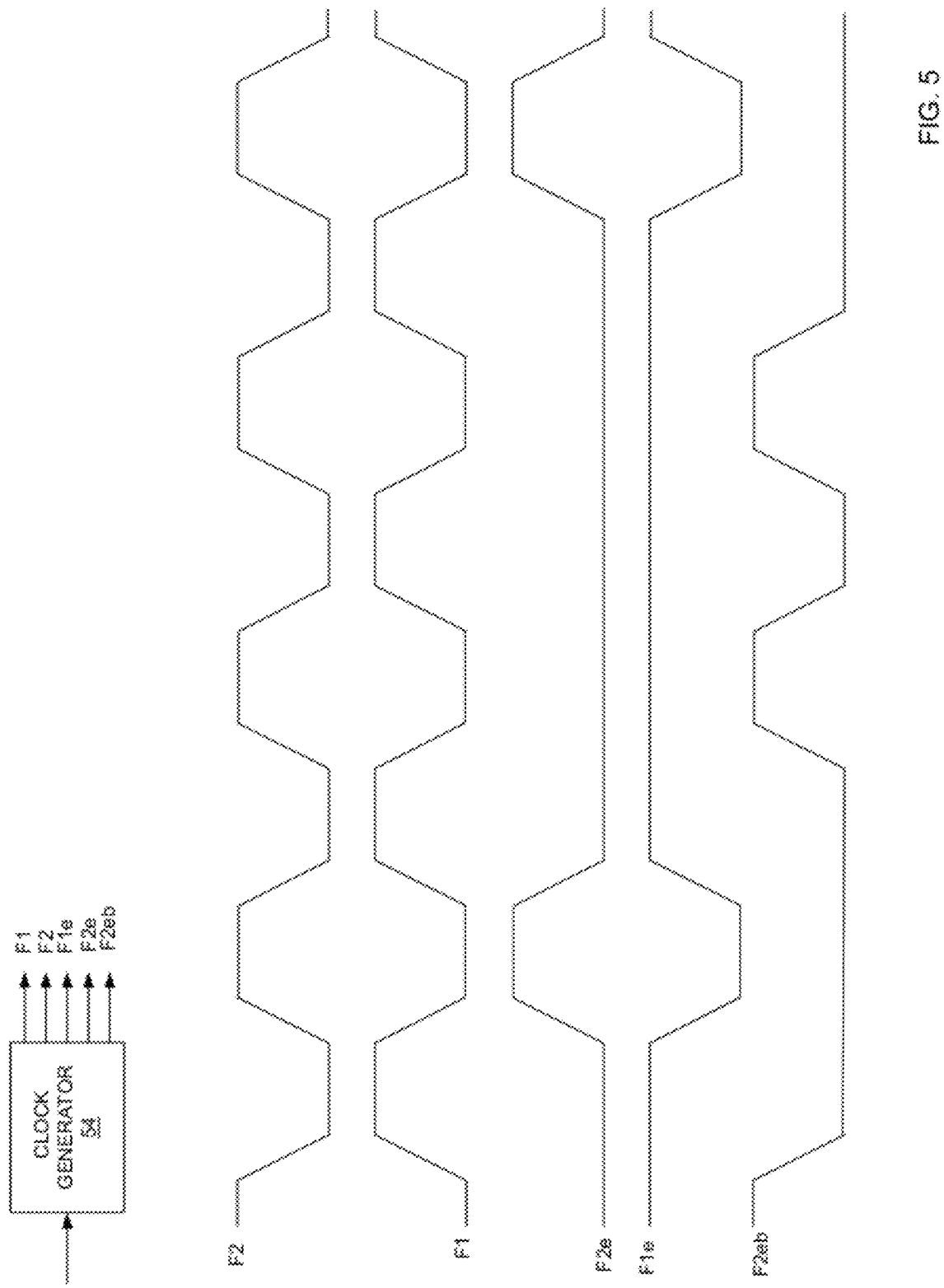
FIG. 5 illustrates a clock system for a pipelined ADC according to an exemplary embodiment of the present invention.

FIG. 4 illustrates a multiplying ADC with a dummy load system 52 to balance the loads to the main pipeline according to an exemplary embodiment of the present invention. The MDAC 40 and error extraction circuit 42 of FIG. 4 are the same as those in FIG. 3. Additionally, a dummy load 52 may be coupled to the MDAC 40 at its summing node 44 through a switch engaging and disengaging according a clock cycle F2eb. One objective of the dummy load 52 may be to provide a same or substantially the same load as the error correction circuit 42 when the error correction circuit is switched off from the main pipeline. Thus, the clock cycle F2eb, as shown in FIG. 5, may occur whenever the main pipeline outputs signal—i.e., when F2 occurs, but F2e does not occur—to balance the load and reduce the spur noise at the output. Thus, for the example of FIG. 5, every three occurrences of F2 may correspond to one occurrence of F2e and two occurrences of F2eb where the occurrences of F2e and F2eb do not overlap. FIG. 5 is only for illustrative purposes. Other arrangements also may be possible. For example, it is easy to generalize to a situation where every M (an integer) occurrences of F2 may correspond to one occurrence of F2e and M−1 occurrences of F2eb where the one occurrence of F2e is at a time different from the M−1 occurrences of F2eb. The load of the dummy load 52 is designed to balance the overall loads to the main pipeline so that the main pipeline may have substantially constant load during data conversion. In one example embodiment, the load may be a capacitor Ce1b that has capacitance equal to or similar to that of Ce1 as illustrated in FIG. 5. In other embodiments, the dummy load 52 may include other circuits that exert a similar load on the main pipeline as the error correction circuit 42 when it is engaged to the MDAC 40.

Figure 6:
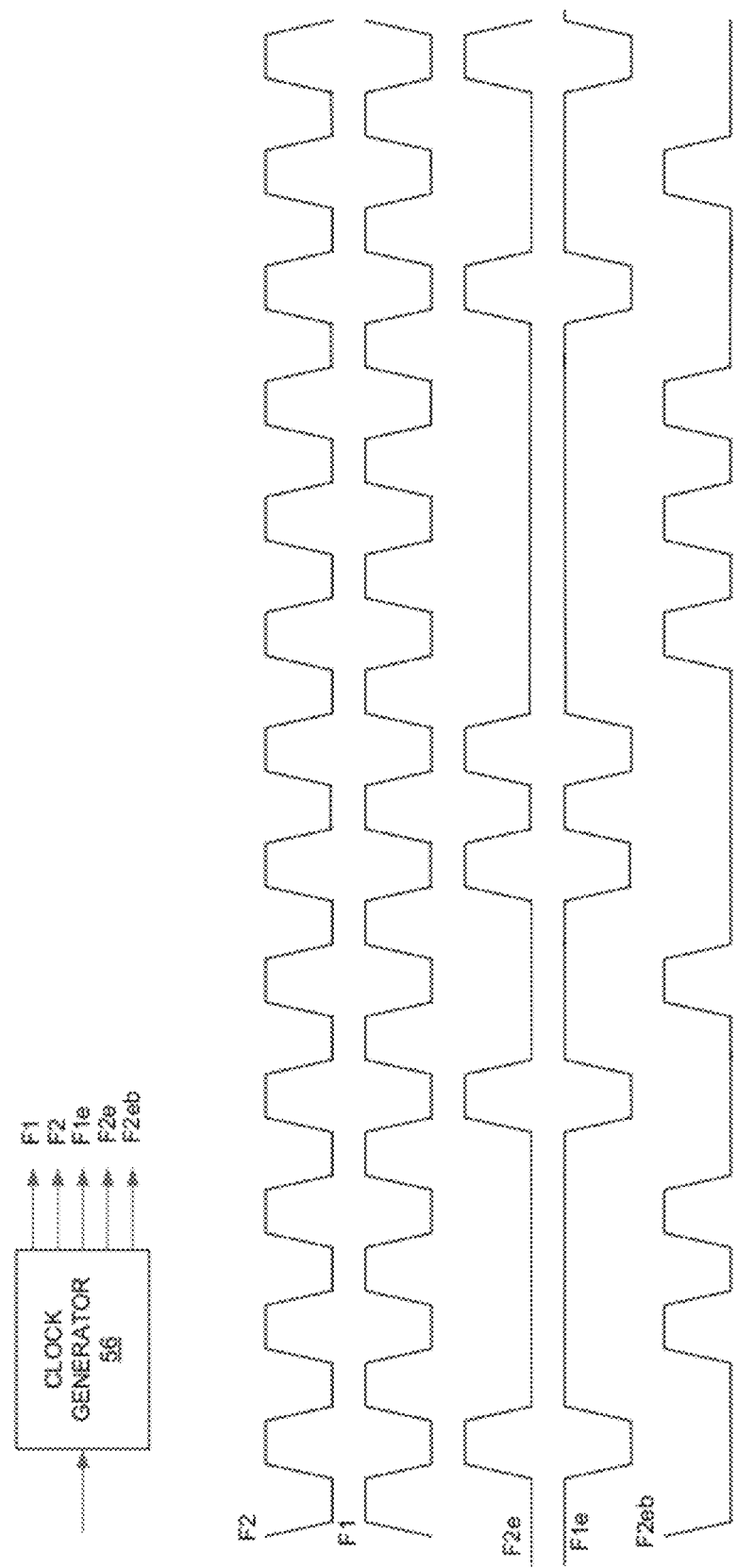
FIG. 6 illustrates a variable clock system for a pipelined ADC according to an exemplary embodiment of the present invention.

Variability also may be introduced to clock cycles to spread and mask the spur noise. FIG. 6 illustrates a clock system for a pipelined ADC according to an exemplary embodiment of the present invention. A clock generator 56 may generate clock cycles that have certain variable aspects. In one embodiment, as shown in FIG. 3, the occurrences of F2e (correspondingly, F1e) may be randomized according to a probability distribution such as a uniform distribution. Thus, the clock generator 56 may have a random number generator (not shown) to randomly generate the occurrence of F2e clock cycle. In one preferred embodiment, the random generator may generate a random number R1 indicating that a counter may count R1 of F1 clock cycles until next F2e occurs. When the next F2e occurs, the random number generator may generate another random number R2 indicating how many F1 clock cycles until next F2e occurs. Thus, instead of periodical occurrences, F2e may occur at a random clock cycle. The random occurrences of F2e and F1e may spread spur noise over the whole spectrum to whitening the spur noise. When cooperated with a dummy load system as shown in FIG. 6, it follows that the numbers of F1, F2, and F2eb clock cycles between two consecutive F2e (or F1e) also may be random. In this way, any further spur noise after load balancing may be spread over the whole spectrum. The random occurrences of F2e also may be pseudo-random. For example, F2e may occur periodically but with a random adjustment. In one embodiment, F2e may occur randomly at a clock cycle in the range of cycles [8, 12] out of every twenty clock cycles.

Alternatively, in another embodiment of the present invention, the clock generator 56 may vary the occurrences of F2e clock cycles according to predetermined patterns. In this embodiment, the clock generator may include a counter (not shown) that may generate a sequence of integers indicating the clock cycle at which F2e may occur. For example, when N=3, a sequence of (1, 2, 3, 1, 2, 3 . . . ) may indicate that F2e may occur at clock cycle 1 for the first digital output, at clock cycle 2 for the second digital output, and at clock cycle 3 for the third digital output, and so on. Another example sequence may be (1, 2, 3, 3, 2, 1, 1, 2, 3, 3, 2, 1 . . . ). Other sequences also may be possible. In this way, the spur noise may be mitigated at a lower cost than a randomized sequence.

Figure 7:
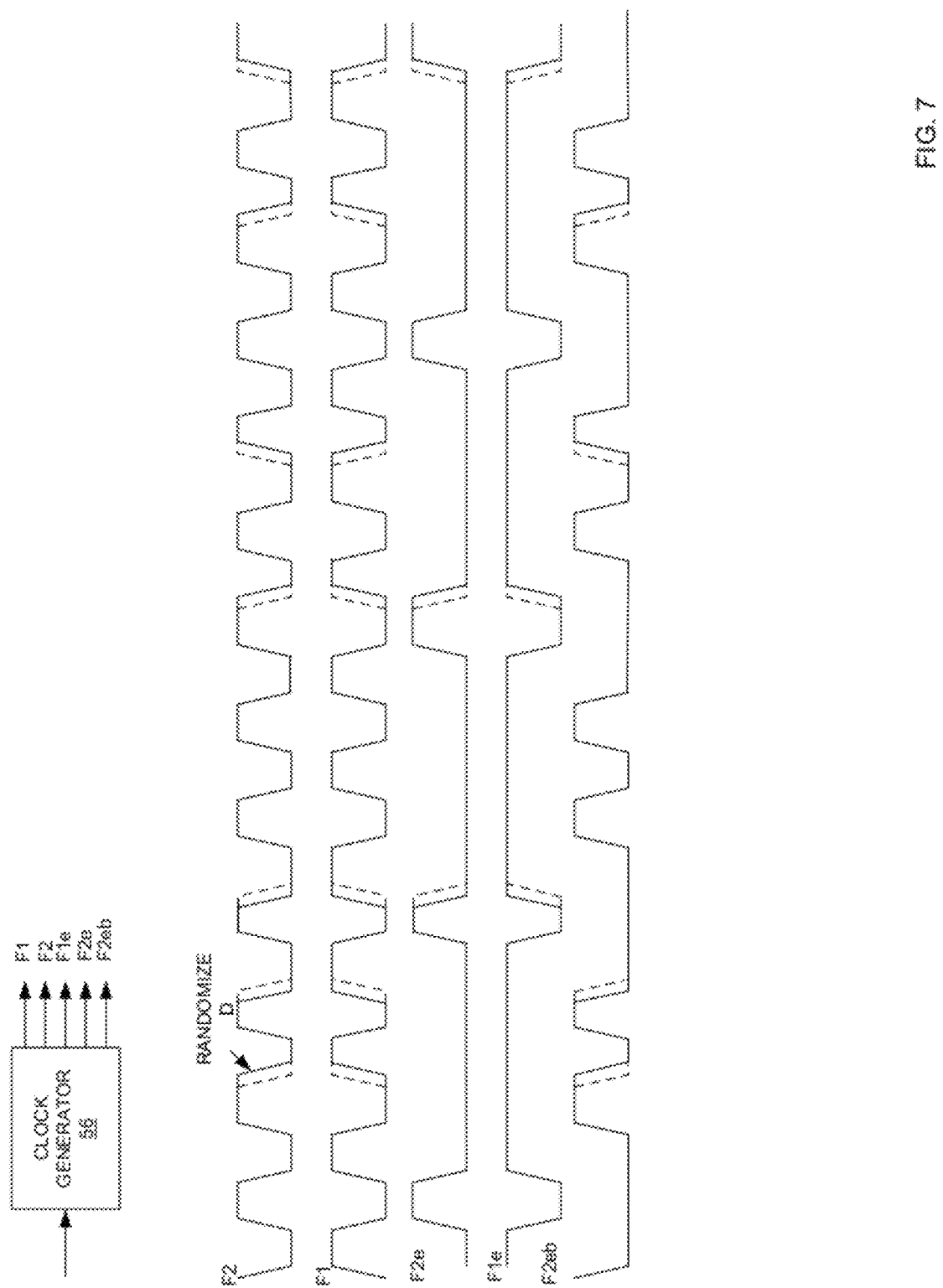
FIG. 7 illustrates another variable clock system for a pipeline ADC according to an exemplary embodiment of the present invention.

The edge locations and widths of the clock cycles also may be randomized. FIG. 7 illustrates another clock system for a pipelined ADC according to an exemplary embodiment of the present invention. For example, the edges of F1, F2, F1e, F2e, and F2eb may occur at positions that have random adjustments from their normal periodical positions (dashed lines). The amount of random adjustments may obey certain probability distributions such as a uniform distribution. Thus, the widths of the F1, F2, F1e, F2e, and F2eb also may vary in a random manner.

Those skilled in the art may appreciate from the foregoing description that the present invention may be implemented in a variety of forms, and that the various embodiments may be implemented alone or in combination. For example, the dummy load of FIG. 4 may run according to clock cycles as shown in FIG. 6, FIG. 7, or a combination of the clocks of FIGS. 6 and 7. Therefore, while the embodiments of the present invention have been described in connection with particular examples thereof, the true scope of the embodiments and/or methods of the present invention should not be so limited since other modifications will become apparent to the skilled practitioner upon a study of the drawings, specification, and following claims.

What is claimed is:

1. An analog-to-digital converter system, comprising:
   a pipeline including N successively-cascaded signal converters, each converting, according to a first clock signal, a respective portion of an input signal of the pipeline into digital codes, wherein:
   a) all but a last one of the signal converters include an amplifier for amplifying a signal received at an amplifier input node with a gain; and
   b) the digital codes generated by a signal converter correspond to an output signal of a preceding signal converter in the pipeline;

a code aligner for receiving and aligning the digital codes from the signal converters in the pipeline into a digital output of the system;

an error extractor coupled to the amplifier input node of a selected one signal converter via a first switch for extracting an error signal, wherein:
 a) the first switch is engaged/disengaged according to a second clock signal; and
 b) when the first switch is engaged, the error extractor exerts a load to the pipeline; and a load system coupled to the amplifier input node of the selected one signal converter via a second switch, wherein:
 a) the second switch is engaged/disengaged according to a third clock signal; and
 b) when the second switch is engaged, the load system provides a load substantially the same as the load of the error extractor to the pipeline.

2. The analog-to-digital converter system of claim 1, further comprising:
 a controller configured to calculate an adjustment based on the error signal and apply the adjustment to the digital output of the system for more accurate digital output.

3. The analog-to-digital converter system of claim 1, wherein the N successively-cascaded signal converters convert the input signal into the digital output over N successive clock cycles of the first clock signal.

4. The analog-to-digital converter system of claim 3, wherein if the first switch is engaged over one clock cycle of the second clock signal, the second switch is engaged in all clock cycles of the third clock signal except for the one during which the first switch is engaged.

5. The analog-to-digital converter system of claim 3, further comprising a clock generator for generating the first, second, and third clock signals.

6. The analog-to-digital converter system of claim 5, wherein the clock generator generates at least one of the first, second, and third clock signals with at least one variable aspect.

7. The analog-to-digital converter system of claim 5, wherein the clock cycles of the second clock signal occurs randomly according to a probability distribution.

8. The analog-to-digital converter system of claim 5, wherein the clock cycles of the second clock signals varies according to a predetermined sequence.

9. The analog-to-digital converter system of claim 6, wherein widths of the clock cycles of the first, second, and third clock signals vary randomly according to a probability distribution.

10. The analog-to-digital converter system of claim 6, wherein edges of the clock cycles of the first, second, and third clock signals vary randomly according to a probability distribution.

11. The analog-to-digital converter system of claim 1, wherein the load balancer includes a capacitance load.

12. The analog-to-digital converter system of claim 1, wherein N is an integer that is greater than 1.

13. The analog-to-digital converter system of claim 1, wherein the selected one signal converter is a first one in the pipeline.

14. An analog-to-digital converter system, comprising:
 a pipeline including N successively-cascaded signal converters, each converting, according to a first clock signal, a respective portion of an input signal of the pipeline into digital codes, wherein:
  a) all but a last one of the signal converters include an amplifier for amplifying a signal received at an amplifier input node with a gain; and
  b) the digital codes generated by a signal converter correspond to an output signal of a preceding signal converter in the pipeline;
 a code aligner for receiving and aligning the digital codes from the signal converters in the pipeline into a digital output of the system;
 an error extractor coupled to the amplifier input node of a selected one signal converter via a switch for extracting an error signal, wherein:
  a) the switch is engaged/disengaged according to a second clock signal; and
  b) when the switch is engaged, the error extractor exerts a load to the pipeline; and
 a clock generator for generating the first and second clock signals,
 wherein the clock generator generates at least one of the first and second clock signals with at least one variable aspect.

15. The analog-to-digital converter system of claim 14, wherein the clock cycles of the second clock signals occurs randomly according to a probability distribution.

16. The analog-to-digital converter system of claim 14, wherein occurrences of the clock cycles of the second clock signals vary according to a predetermined sequence.

17. The analog-to-digital converter system of claim 14, wherein widths of clock cycles of the at least one of the first and second clock signals vary randomly according to a probability distribution.

18. The analog-to-digital converter system of claim 14, wherein edges of clock cycles of the at least one of the first and second clock signals vary randomly according to a probability distribution.

* * * * *